United States Patent [19]

Doyle

[11] Patent Number: 5,825,153
[45] Date of Patent: Oct. 20, 1998

[54] SWITCHED RELUCTANCE MOTOR DRIVE CONTROL SYSTEM

[75] Inventor: Paul C. Doyle, Northville, Mich.

[73] Assignee: United Technologies Automotive, Inc., Dearborn, Mich.

[21] Appl. No.: 763,976

[22] Filed: Dec. 10, 1996

[51] Int. Cl.⁶ .................................................. H02P 7/05
[52] U.S. Cl. ........................................... 318/701; 318/254
[58] Field of Search ................................ 318/254, 434, 318/701, 685, 696

[56] References Cited

U.S. PATENT DOCUMENTS

| | | | |
|---|---|---|---|
| 4,654,568 | 3/1987 | Mansmann | 318/293 |
| 5,032,774 | 7/1991 | Juzswik | 318/293 |
| 5,245,523 | 9/1993 | Juzswik | 318/599 X |
| 5,559,375 | 9/1996 | Jo et al. | 318/471 X |
| 5,585,701 | 12/1996 | Kaida et al. | 318/254 |

*Primary Examiner*—Bentsu Ro
*Attorney, Agent, or Firm*—Niro, Scavone, Haller & Niro

[57] ABSTRACT

A current measuring apparatus measures current flowing through a phase winding of a switched reluctance motor while dissipating very little power. The apparatus includes a control for controlling the current flowing through the winding. A gate is operatively connected to the control for switching the current flowing through the winding. The arrangement is such that in a first mode of the gate, the current flows through the phase winding. In a second mode of the gate, flow of the current through the winding is inhibited. The gate includes a sense means for sensing a fraction of the current when the gate is in the first mode thereof. A resistor of relatively high resistance is electrically connected in series with the sense means such that a voltage drop occurs across the resistor when the gate is in the first mode. The voltage drop signal is fed back to the control so that dependent on the signal, the current flowing through the phase winding of the motor is maintained in order to maximize motor efficiency.

2 Claims, 3 Drawing Sheets

SWITCHED RELUCTANCE MOTOR DRIVE CONTROL SYSTEM

FIELD OF THE INVENTION

The present invention relates to a current measuring apparatus for sensing a current flowing through the phase windings of a switched reluctance motor.

More specifically, the present invention relates to a switched reluctance motor having sensing means for measuring the current flowing through a phase winding so that switching of the phase windings is optimized.

Additionally, and more specifically, the present invention provides a current sensing apparatus for a switched reluctance motor which reduces power loss, facilitates measurement of a sense current and is less expensive than the prior art arrangements.

BACKGROUND OF THE INVENTION

Switched reluctance motors typically include a stationary stator and a rotor rotatably disposed within the stationary stator.

The stator often includes three phase windings equally spaced around the rotor. The stator windings are usually manufactured from laminated soft iron sheets with each phase winding including a pair of circumferentially spaced poles. Each pair of poles of a phase winding is wound in series in such a manner that when connected to a source of direct current, opposite polarity is induced in the poles.

Accordingly, in a three phase switched reluctance motor, six poles are spaced circumferentially around the rotatable rotor so that diametrically opposed poles have different polarities.

The rotor in a three phase switched reluctance motor usually has four radially extending equally spaced poles that are not wound. The rotor is typically manufactured as a laminated soft iron rotor which is free to rotate within a magnetic field selectively induced by switching the direct current flowing through the phase windings in order to impart torque to the rotor.

The switched reluctance motor is a synchronous motor which increases in rotational speed until the speed reaches a predetermined steady state amount. A given rotational speed reflects a given switching rate. The level of current allowed to pass through the windings directly controls rotational speed and, consequently, switching rate.

More specifically, in order to achieve controllable torque and for increasing the efficiency of the motor, it is essential that current through each phase winding be maintained at an optimum amount. Current flow data is fed back to a central control which controls the amount of current flow to the phase winding by selectively switching on and off a coupled semiconductor device. Additionally, such data is processed by the central control for switching off the current flow to the preceding phase winding so that rotation of the rotor is maintained and optimized.

Typically, switched reluctance motors (SRMs) require the selective switching of each phase coil or winding to produce torque. A distinction is made in such motors between a so-called "soft chop" and a so-called "hard chop." A soft chop is the selective periodic activation and deactivation of a current source through a single winding performed to maintain current at a discrete level through that particular winding. Since all windings are inductive, current rises and decays gradually rather than instantly. The soft chop duty cycle establishes an "average" current through the winding that is some fraction of the maximum steady state current attainable with a particular current source. A fraction is desired because a switched reluctance motor is of generally very low resistance as a lumped element. Thus without some kind of control of current through the windings, an activated SWM will always draw maximum current, will run at maximum speed, and will dissipate enormous power. Among other problems, such a situation might create a safety or fire hazard. Typically each winding pair of an SWM is coupled to two semiconductor devices: a high side and a low side. The soft chop is achieved by keeping the low side device on and selectively toggling the high side one on and off.

A hard chop on the other hand is the periodic complete deactivation of current through a particular winding and the switching of the current to the next winding in sequence. When motor speed reaches a steady state (reflective of the current allowed to pass through the windings), the hard chop frequency (i.e., the switching rate) reaches a constant value. Typically the hard chop is achieved by switching both the high and the low side semiconductor devices off for a particular winding, and then activating the high and low side semiconductor devices for a next winding in the sequence.

Although, in the aforementioned description, three phase windings have been described, it is also not unusual to have four phase coils or windings. To control the amount of torque produced, the current in each phase must be controlled. When gate means such as a semiconductor device are switched by the control means to the "on" mode, a voltage drop is produced across a shunt resistor electrically connected to the semiconductor device, typically the low side semiconductor device. The voltage drop is amplified and fed back to the control. When the phase coil or winding current reaches a pre-determined level, the control will shut the semiconductor device to the "off" mode.

However, in the aforementioned arrangement, the shunt resistor must carry the full phase winding current when the semiconductor device is in the "on" mode. Accordingly, the power dissipated by such control-coupled shunt resistor greatly decreases the efficiency of the motor drive.

Although attempts have been made to utilize smaller shunt resistances in order to reduce such power loss, trace resistance in such smaller shunt resistance assemblies make the measurement of the voltage drop less accurate. Additionally, small shunt resistors make it very difficult to measure small currents. Another problem with the provision of small or low resistance shunts is that they are relatively expensive compared to a typical resistance shunt.

Accordingly, it is a primary objective of the present invention to provide a current measuring apparatus for measuring a current flowing through a phase winding of a switched reluctance motor that overcomes the problems and disadvantages associated with the prior art arrangements.

Other objects and advantages of the present invention will be readily apparent to those skilled in the art by a consideration of the detailed description contained hereinafter taken in conjunction with the annexed drawings.

SUMMARY OF THE INVENTION

The present invention overcomes the aforementioned problems associated with the prior art arrangements by using a drain sensing semiconductor device that "bleeds off" a portion of the drain current. Such "bleed off" sensing current is typically 1/3000th of the total drain current. The sensing current is routed through a low power resistive shunt thereby causing a voltage drop across such shunt.

Furthermore, the voltage drop is amplified and fed back to the control for further processing and comparison with preset parameters, as is well known in the art, to optimize the switching of a subsequent phase winding.

A significant advantage of the present arrangement is that since the current being measured is only a small portion of the drain current, the shunt resistor can be relatively large without dissipating significant power. The resistor can be a typical resistor which is less costly than the small resistance required in the prior art.

The apparatus includes control means for controlling the current flowing through the phase winding and gate means such as a semiconductor device operatively connected to the control means for switching the current flowing through the phase winding. The arrangement is such that in a first mode of the gate means, the current flows through the phase winding and in a second mode of the gate means, current flow through the winding is inhibited.

More specifically, the gate means further includes sense means for draining a portion of the current when the gate means is in the first mode thereof.

A resistive means is electrically connected in series with the drain means such that a voltage drop occurs across the resistive means when the gate means is in the first mode.

A generator means generates a signal which corresponds with the voltage drop across the resistive means. The signal is fed back to the control means so that dependent on the signal, the control means controls the current flowing through a subsequent phase winding of the motor to optimize selective switching of each phase winding of the motor for maximizing the torque thereof.

In a more specific embodiment of the present invention, the control means includes a microcontroller which is capable of comparing the signal corresponding to the voltage drop with certain parameters for optimizing the current flow to a subsequent phase winding. The arrangement is such that the current is supplied in sequence to each phase winding in order to optimize rotation of the rotor and to maximize the torque imparted thereto.

The signal generated by the generating means corresponds with the amplified voltage drop across the resistive means. Such signal is fed back to the control means. The arrangement is such that the high side gate means is selectively toggled to maintain current at a predetermined level through the winding. The aforementioned signal which is fed back to the control means or controller is compared by the microprocessor with various parameters. The control means switches the semiconductor device at the optimal timing so that the subsequent phase winding induces a strong magnetic field when the approaching rotor pole is at a predetermined location relative to the subsequent phase winding for optimizing the efficiency of the motor.

Many variations and modifications of the present invention will be readily apparent to those skilled in the art by a consideration of the detailed description contained hereinafter taken in conjunction with the annexed drawings. However, such modifications and variation fall within the spirit and scope of the present invention as defined by the appended claims.

DETAILED DESCRIPTION

Figure 1:
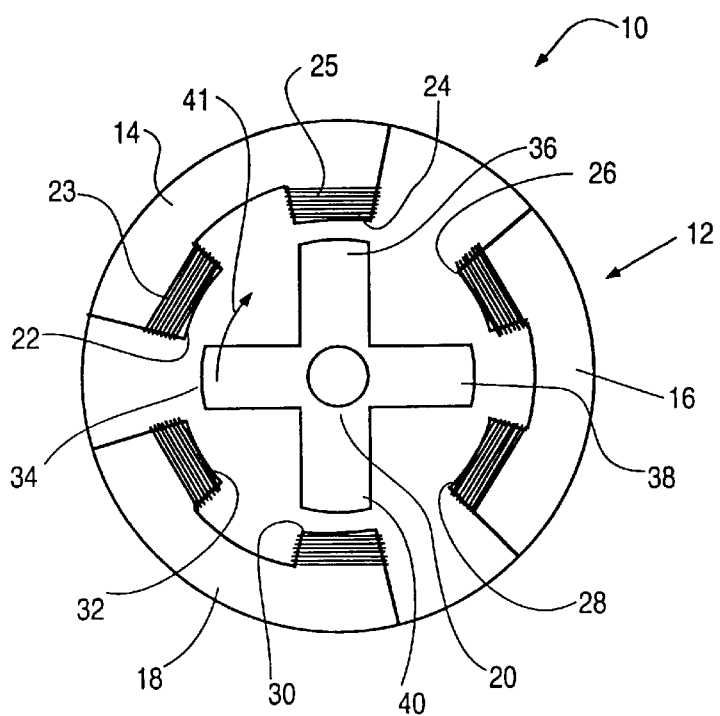
FIG. 1 is a sectional view of a prior art three phase switched reluctance motor.

FIG. 1 is a sectional view of a typical switched reluctance motor generally designated 10. The motor 10 includes a stationary stator generally designated 12 having three phase windings 14, 16, and 18 equally spaced circumferentially around a rotor 20 rotatably disposed within the stationary stator 12.

Each phase winding 14, 16 and 18 includes a pair of stationary stator poles 22, 24, 26, 28, 30, 32 such that windings 23 and 25 of stator poles 22 and 24 respectively are wound in series and induce within stator poles 22, 24 opposite polarity when a current flows through such windings 23, 25. Typically the stator poles 22, 24, 26, 28, 30, 32 are fabricated from laminated soft iron so that a magnetic field is easily induced therein when a current flows through the inductive windings.

The rotor 20 shown in FIG. 1 has four salient or protruding poles 34, 36, 38 and 40. The arrangement is such that diametrically opposed stator poles, for example 22 and 28 are of opposite polarity so that when for example rotor pole 34 is in the vicinity of stator pole 22, rotor poles 34 and 38 have opposite polarities.

When current is supplied for example to the phase winding 14, the rotor pole 34 is attracted towards stator pole 22 so that torque as indicated by arrow 41 is imparted to the rotor 20.

However, when the rotor pole 34 is aligned with the stator pole 22, it will be evident that further current flow through the winding 14 will not increase the rotor torque. In fact, in order to optimize the efficiency of the motor, it is necessary to switch the current from the phase winding 14 to the next phase winding 16 in sequential order prior to the rotor pole 34 reaching the point of alignment with the stator pole 22. Such switching typically occurs when stator pole 22 reaches a predetermined angular relationship with rotor pole 34.

Consequently, by sequentially switching the current flow to each of the three phase windings 14, 16 and 18, torque is imparted to or applied to the rotor 20 in order to accelerate and maintain the speed of the same. The rotational speed of the rotor 20 corresponds to a selected rate of switching of the phase windings 14, 16 and 18.

From the above, it is evident that measuring the current flow to the phase windings is an important factor with regard to optimizing the efficiency of a switched reluctance motor. Also, it is necessary to permit flow to a subsequent phase winding at a specific condition after the current flow has been terminated in the preceding phase winding.

Figure 2:
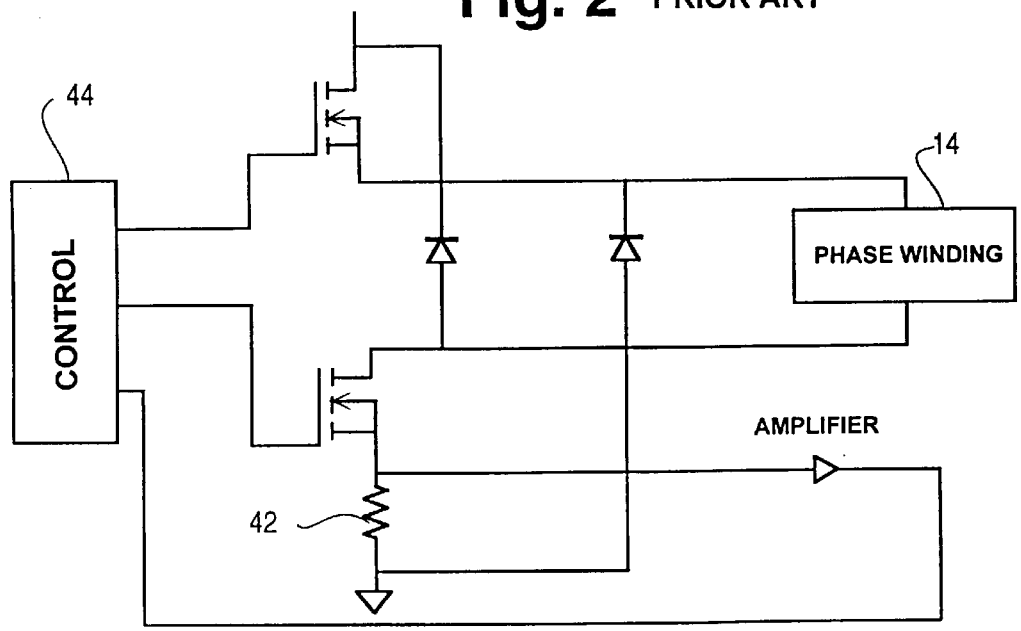
FIG. 2 is a circuit diagram of a prior art arrangement for measuring a current flowing through a phase winding of a switched reluctance motor.

In a typical prior art means as shown in FIG. 2 for measuring the current flow through a phase winding 14 in a switched reluctance motor, the drain current is fed through a resistance 42 and the voltage drop across such resistance 42 is measured and fed back to a control 44 for switching a subsequent phase winding.

However, the aforementioned arrangement has meant that the full phase winding current flowed through the resistance 42. Accordingly, it has been customary to provide a relatively low resistance shunt in order to avoid excessive dissipation of energy. However, such relatively low resistance shunts are costly and it is not always easy to accurately measure the voltage drop across such a distance shunt.

Figure 3:
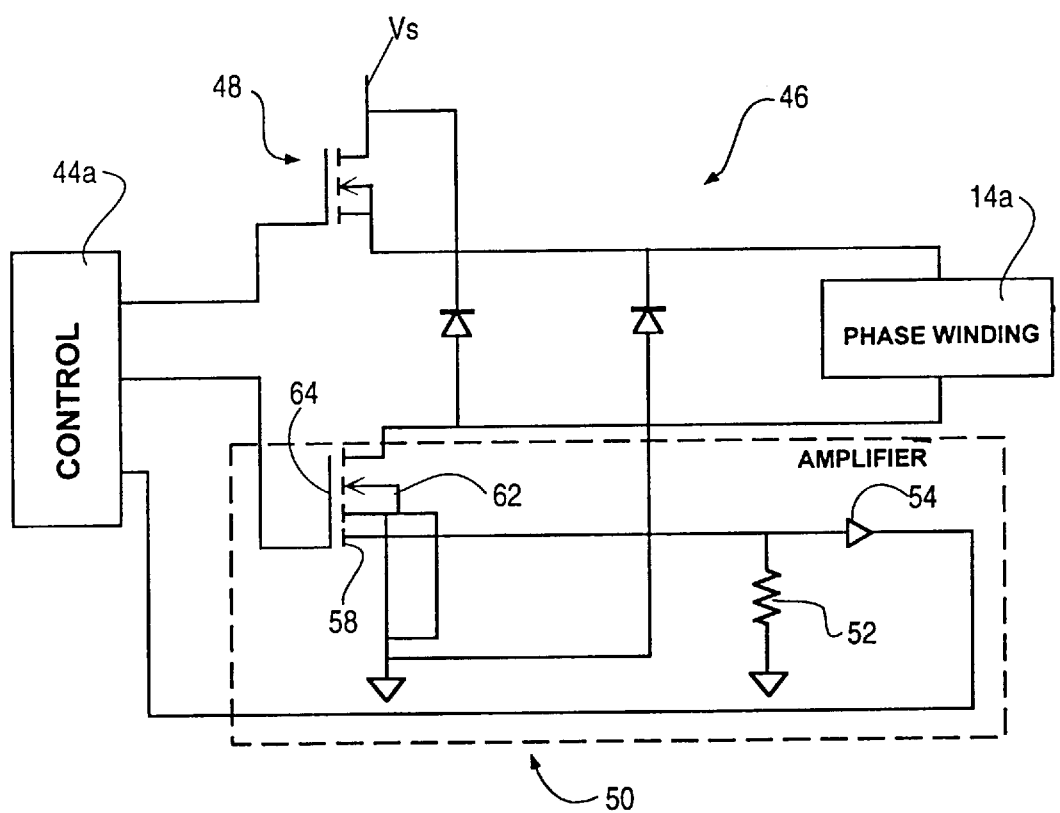
FIG. 3 is a circuit diagram of a current measuring apparatus for measuring a current flowing through a phase winding of a switched reluctance motor according to the present invention.

FIG. 3 is a circuit diagram showing a current measuring apparatus 46 for measuring a current flowing through a phase winding 14a of a switched reluctance motor according to the present invention. The apparatus 46 includes control means 44a for controlling the current flowing through the winding 14a. It is understood that current will flow at all through winding 14a during only a selected portion of the hard chop duty cycle. The discussion below specifically describes control of current during its activation through winding 14a.

Gate means generally designated 48 is operatively connected to the control means 44a for switching the current flowing through the winding 14a. Likewise, gate means 64 is operatively connected to control means 44a for switching the current flowing through the winding 14a. The arrangement is such that in a first mode of the gate means 48 and 64, the current flows through the phase winding 14a and in a second mode of the gate means 48 and 64, flow of the current through the winding 14a is inhibited. Control means 44a turns on gate means 48 and 64, i.e. places them in the first mode, to enable current flow through winding 14a.

Figure 4:
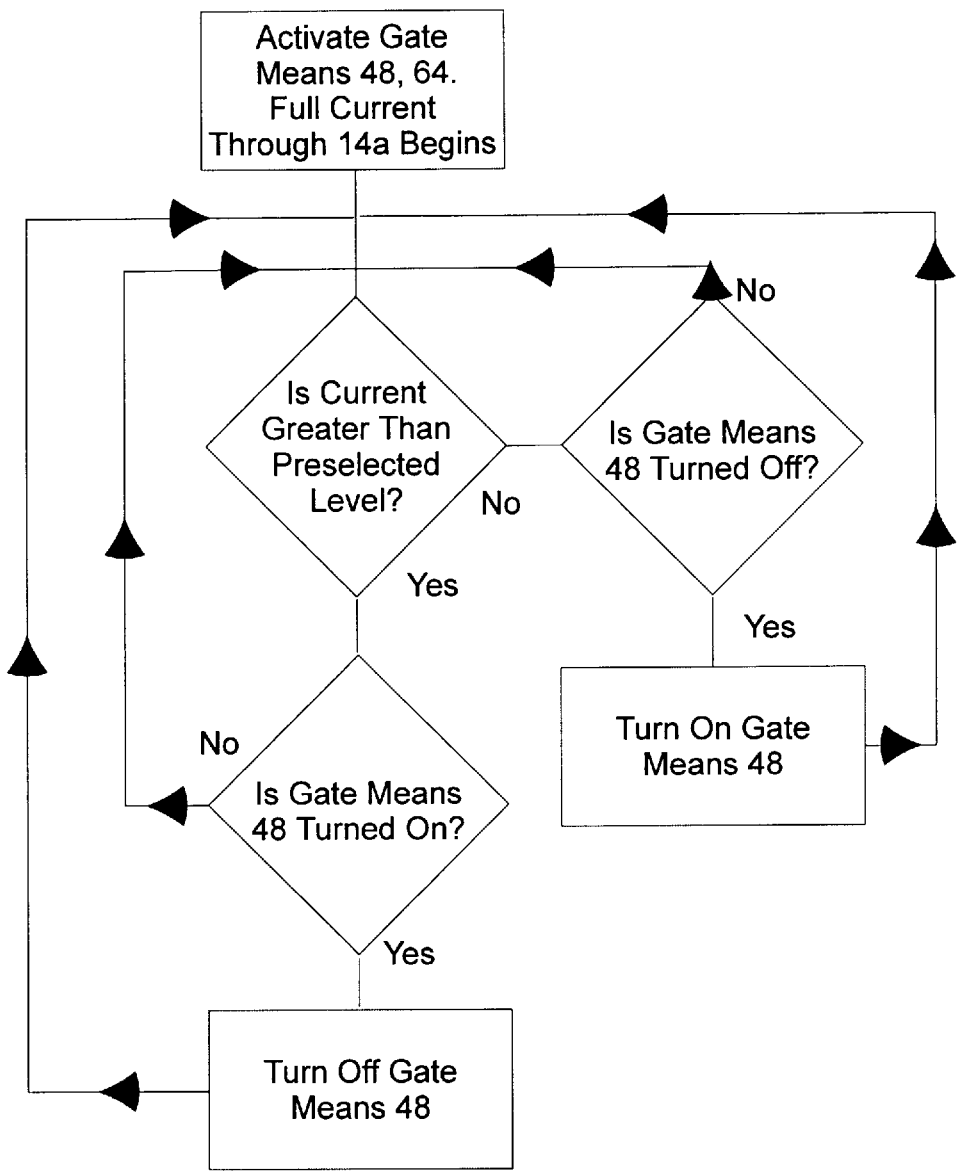
FIG. 4 is a flow diagram illustrating control of the soft chop.

As in a typical control system, a desired steady state level of current is preselected, and control means 44a contains a setting, preferably a register, set with a value corresponding to that level. Initialization of current through winding 14a commences with the full forward biasing of gate means 48. At first, since the winding acts as an inductor and cannot receive all current instantly due to the well known principle of induced back emf, a small amount of current enters winding 14a. Then, as the rotor rotates under torque, more current passes through winding 14a. Eventually, an amount of current corresponding to the preselected steady state amount courses through the winding. Upon this occurrence, gate means 48 is turned off while gate means 64 remains on. This allows winding 14a current to decay below the threshhold amount. When winding 14a current is decreased sufficiently, control means 44a reactivates gate means 48. This soft chopping switching cycle maintains winding 14a current within a very narrow predetermined range. The range is narrow enough that it is effectively a discrete value. FIG. 4 is a flow diagram illustrating the foregoing soft chop control. Ultimately, the pertinent rotor reaches a predetermined angular orientation with its corresponding pole and the current is completely switched off by deactivation of gate means 48 and 64, a hard chop. In other words, both gate means 48 and 64 are placed in the second mode. In general, for a three winding SRM, the hard chop duty cycle in the steady state is ⅓. Thus the system is constructed as a negative feedback loop, able to effect optimized current level and current switching between the respective windings while steady state current equilibrium is maintained.

The gate means 48 is a semiconductor device, preferably an n-channel field-effect transistor such as International Rectifier part number IRFP054. Gate means 64 is also a semiconductor device, preferably a current sensing n-channel field-effect transistor such as International Rectifier part number IRCP054. Gate means 64 has a sensing means 58. Gate means 64 also has a drain means 62. When gate means 64 is forward biased, a current passes through drain means 62, and a fraction of the same current (on the order of 1/3000) passes through sensing means 58.

Resistive means 52 is electrically connected in series with the sensing means 58 such that a voltage drop occurs across the resistive means 52 when the gate means 48 and 64 are in the first mode. Resistive means 52 is of relatively high resistance and is much less costly compared to prior art low resistive means 42 of FIG. 2. Resistive means 42 is typically 10 milliohms while resistive means 52 in the preferred embodiment is 1 ohm. Consequently, resistive means 52 requires very little current to enable the controller to receive winding 14a current information. It thus dissipates less power, is less expensive to construct, is less expensive to operate, and is much less subject to random measurement errors.

Amplifier means 54 are provided for amplifying the voltage drop across the resistive means 52. The amplifier means is preferably a prefabricated analog integrated circuit, and more preferably an AD626 instrumentation amplifier manufactured by Analog Devices. Amplifier means 54 helps to generate a signal corresponding to the voltage drop. The signal is fed to the control means 44a so that dependent on the signal, the control means 44a controls the current flowing through phase windings of the motor to optimize current flow as described above of each phase winding of the motor for maximizing the torque thereof. As shown in FIG. 3, the control means 44a is a microprocessor or microcontroller. Supply voltage in the figure is denoted by Vs.

The present invention provides means for efficiently switching the phase windings in a switched reluctance motor while reducing the manufacturing cost thereof. It will be appreciated that those skilled in the art may now make many uses and modifications of the specific embodiments described without departing from the inventive concepts. For example, while the sensing impedance means has been described as coupled to the low side semiconductor device, it is within the invention without undue experimentation to couple the sensing impedance means to the high side device instead. Consequently, the invention is to be construed as embracing each and every novel feature and novel combination of features present in the foregoing description.

What is claimed is:

1. A current measuring apparatus for measuring a current flowing through a phase winding of a switched reluctance motor, the apparatus comprising:

control means for controlling the current flowing through the winding;

gate means operatively connected to the control means for switching the current flowing through the winding, the arrangement being such that in a first mode of the gate means, current flow through the phase winding is encouraged and in a second mode of the gate means, current flow through the winding is inhibited;

the gate means further including:

sense means for sensing a fraction of the current when the gate means is in the first mode thereof;

resistive means electrically connected in series with the sense means such that a voltage drop occurs across the resistive means when the gate means is in the first mode;

means for generating a signal which corresponds with the voltage drop, the generating means including an amplifier for amplifying the voltage drop, the signal being fed to the control means so that dependent on the signal, the control means controls the current flowing through the phase winding, wherein the generating means generates a signal which corresponds to the amplified voltage drop, the arrangement being such that the signal is compared by the control means with pre-determined parameters reflective of a selected current level and the control means triggers the flow of current through the phase windings so that a soft chop duty cycle is established whereby the flow of current essentially equals the soft chop duty cycle times the maximum current.

2. A current measuring apparatus for measuring a current flowing through a phase winding of a switched reluctance motor, the apparatus comprising:

a supply voltage corresponding to a maximum current;

control means for controlling the current flowing through the winding;

gate means comprising at least one semiconductor device operatively connected to the control means for switching the current flowing through the winding, the arrangement being such that in a first mode of the gate means, current flow through the phase winding is encouraged and in a second mode of the gate means, current flow through the winding is inhibited;

the gate means further including:

a source electrically coupled to a direct current source;

a drain selectively isolated from the source;

a gate electrically coupled to the control means such that dependent upon the control means the gate is selectively opened to permit flow of the current through the drain from the source;

sense means for sensing a fraction of the current when the gate means is in the first mode thereof;

resistive means electrically connected in series with the sense means such that a voltage drop occurs across the resistive means when the gate means is in the first mode;

means for generating a signal which corresponds with the voltage drop, the signal being fed to the control means so that dependent on the signal, the control means controls the current flowing through the phase winding, wherein the generating means generates a signal which corresponds to the amplified voltage drop, the arrangement being such that the signal is compared by the control means with pre-determined parameters reflective of a selected current level and the control means triggers the flow of current through the phase windings so that a soft chop duty cycle is established whereby the flow of current essentially equals the soft chop duty cycle times the maximum current.

* * * * *